United States Patent [19]
Mori et al.

[11] Patent Number: 5,360,943
[45] Date of Patent: Nov. 1, 1994

[54] ELECTRICAL CONNECTION STRUCTURE

[75] Inventors: Hideo Mori, Fujisawa; Hiroshi Takabayashi, Kawasaki; Masanori Takahashi, Chigasaki, all of Japan

[73] Assignee: Canon Kabushiki Kaisha, Tokyo, Japan

[21] Appl. No.: 953,935

[22] Filed: Sep. 30, 1992

[30] Foreign Application Priority Data

Oct. 2, 1991 [JP] Japan .................. 3-280378
Sep. 25, 1992 [JP] Japan .................. 4-279299

[51] Int. Cl.$^5$ .................. H01B 7/00; H01R 43/00
[52] U.S. Cl. .................. 174/84 R; 174/117 FF;
174/88 R; 439/67; 439/493
[58] Field of Search ............ 174/88 R, 117 FF, 84 R;
439/67, 91, 493

[56] References Cited

U.S. PATENT DOCUMENTS

| | | | |
|---|---|---|---|
| 4,740,657 | 4/1988 | Tsukagoshi et al. | 439/91 X |
| 4,814,040 | 3/1989 | Ozawa | 439/91 X |
| 5,019,201 | 5/1991 | Yabu et al. | 156/273.9 |
| 5,042,919 | 8/1991 | Yabu et al. | 359/88 |
| 5,180,888 | 1/1993 | Sugiyama et al. | 174/88 R X |

Primary Examiner—Timothy V. Eley
Assistant Examiner—Khan V. Nguyen
Attorney, Agent, or Firm—Fitzpatrick, Cella, Harper & Scinto

[57] ABSTRACT

An electrical connection structure includes electrodes formed on a device side, electrodes formed on a flexible film carrier having an electrode pattern connected to a drive circuit, and an anisotropic conductive film having metal particles or metal plated particles dispersed therein, interposed between the electrodes on the device side and the electrodes on the flexible film carrier, for electrically connecting the electrodes facing each other through thermocompression bonding. The electrodes on the flexible film carrier are exposed by removing the flexible film at an electrical connection area and the length of each exposed electrode is from 1.5 mm to 2.5 mm.

5 Claims, 4 Drawing Sheets

A: CENTER LINE OF FLEXIBLE INSULATING FILM (SECTION 10-10)

ELECTRICAL CONNECTION STRUCTURE

BACKGROUND OF THE INVENTION

1. Field of the Invention

The present invention relates to an electrical connection structure between an electrical device such as a liquid crystal panel and an external derive circuit, and an electrically connecting method.

2. Related Background Art

For the electrical connection between an electrical device such as a liquid crystal panel having an electrical connection member and an external drive circuit, the method such as shown in FIG. 1 is well known. With this method, a film carrier tape has a copper foil pattern or film carrier electrodes 2 formed on a flexible insulating film 1 connected to a driver circuit (not shown). ITO electrodes 5 are formed on a cell glass 6 of a liquid crystal panel. An adhesive agent having metal particles or metal plated resin particles dispersed therein, forming an anisotropic conductive film 4, is placed between the film carrier electrodes 2 and ITO electrodes, and both the electrodes are thermally compressed by using a thermocompression tool 7 for thermocompression bonding, thereby achieving both the mechanical and electrical connections.

Namely, the film carrier electrodes 2 from the external drive circuit and the device electrodes 5 are aligned with each other. The anisotropic conductive film 4 is placed at the necessary positions between both electrodes. The thermocompression tool 7 or the like heated to a desired temperature is used to thermally compress and bond for achieving both the mechanical and electrical connections.

With the above-described technique, however, the positions of the film carrier electrodes 2 on the flexible film 1 are shifted from those of the panel electrodes 5 because of thermal expansion of the film 1 during the thermocompression bonding, as shown in FIG. 2.

Specifically, a flexible film is generally made of organic material so that it expands when heated. The thermal expansion of a flexible film is generally greater than that of metal. Therefore, the same pitches of the panel electrodes and flexible film electrodes before heating become different because of the thermal expansion of the flexible film during heating.

This phenomenon poses no problem if the pitches are large and the density of electrodes is small (i.e., if wide electrodes are formed at sufficiently large intervals) and if the length of the electrical connection area is short (if the length of the electrically connected electrodes in the longitudinal direction of the film is short).

However, for recent liquid panels, photoelectric conversion element arrays (sensor arrays), recording element arrays such as ink jet recording element arrays and thermal recording element arrays, it has been desired that the electrode area should be as small as possible, and/or that the number of electrodes should be increased as great as possible. In this context, the pitches of electrodes become small and dense, and in some cases the width of the electrical connection area becomes wider, i.e., the number of electrodes increases.

The position or pitch shift of electrodes is therefore likely to occur because of thermal expansion of a flexible film as discussed above.

This pitch shift results in not only defective connection but also in lower mechanical connection strength or damages of the device itself or peripheral circuits caused by overlooking such defective connections.

In the example shown in FIG. 2, the center line of the device electrode connection area is aligned with that of the flexible film.

As shown in FIG. 3, some electrical connections use an overhang structure in which a copper foil 2 is exposed by removing the film carrier flexible film at the electrode connection area in order to eliminate the influence of thermal expansion of the film 1, an anisotropic conductive film 4 being used for the mechanical and electrical connections. With this overhang structure, in order to improve the connection reliability, particularly electrical connection reliability, it is necessary to ensure, e.g., about twenty particles per one connected electrode area. It is therefore necessary for the connected electrode area to have a length of 3 mm or longer. In this case, the length a of the exposed electrode becomes 4 mm or longer with a clearance for allowing a thermocompression tool 7 to fit in the exposed electrode area. Even the overhang structure shown in FIG. 3 has a problem to be solved in order to reduce the length of the exposed electrode area.

A film carrier having outer leads finer than a 100 $\mu$m pitch requires necessarily a pattern of inner wirings of about 80 $\mu$m or less. In this case, it is desirable to use a thin copper foil of about 18 $\mu$m thickness for example in order to obtain a good etching property of copper foil. As shown in FIG. 4, such a thin copper foil exposed electrode has an insufficient strength relative to a force applied perpendicular thereto. In some cases, there occurs the problem that the exposed electrode 3 is bent by cured resin flown from the anisotropic conductive film. Namely, when the thermocompression tool 7 is used, the anisotropic conductive film is pressed, and resin before curing moves to apply a force to the exposed electrode 3 and bend it.

Such bending leads to incorrect electrical connection, as in the case of the pitch shift. If the device is used and such incorrect electrical connection is overlooked, electrical shortage may occur, resulting in possible damage of the device itself and peripheral circuits.

Similar to FIG. 2, in the example shown in FIG. 3, the center line of the device electrode connection area is aligned with that of the flexible insulating film.

SUMMARY OF THE INVENTION

The present invention has been made in consideration of the above-described problems. It is an object of the present invention to provide an electrical connection structure and an electrically connecting method, capable of providing an electrical connection between electrodes of a device such as a liquid crystal panel and electrodes of a circuit such as an external drive circuit.

It is another object of the present invention to provide an electrical connection structure and an electrically connecting method, capable of reliably providing an electrical connection between highly integrated and/or finder electrodes.

It is another object of the present invention to provide an electrical connection structure and an electrically connecting method, capable of providing a reliable electrical connection even at a smaller electrical connection area.

It is another object of the present invention to provide an electrical connection structure and an electrically connecting method, capable of providing a more reliable electrical connection between a number of electrodes.

It is another object of the present invention to provide an electrical connection structure and an electrically connecting method, capable of providing a high manufacturing yield without damaging a device and peripheral circuits.

According to one aspect of the present invention, there is provided an electrical connection structure including:
electrodes formed on a device side;
electrodes formed on a flexible film carrier having an electrode pattern connected to a drive circuit; and
an anisotropic conductive film having metal particles or metal plated particles dispersed therein, interposed between the electrodes on the device side and the electrodes on the flexible film carrier, for electrically connecting both electrodes facing each other through thermocompression bonding,
wherein the electrodes on the flexible film carrier are exposed when the flexible film at an electrical connection area is removed, and the length of each exposed electrode is from approximately 1.5 mm to 2.5 mm.

According to another aspect of the present invention, there is provided an electrically connecting method including the steps of:
facing electrodes formed on a device side with electrodes formed on a flexible film carrier having an electrode pattern connected to a drive circuit;
interposing an anisotropic conductive film having metal particles or metal plated particles dispersed therein between the electrodes on the device side and the electrodes on the flexible film carrier; and
electrically connecting the electrodes on the device side and the electrodes on the flexible film carrier by means of thermocompression bonding,
wherein the electrodes on the flexible film carrier are exposed by removing the flexible film at an electrical connection area, and the length of each exposed electrode is set to a value from approximately 1.5 mm or longer to 2.5 mm.

DETAILED DESCRIPTION OF THE PREFERRED EMBODIMENTS

The present invention will now be described in detail in connection with the preferred embodiments.

Figure 1:
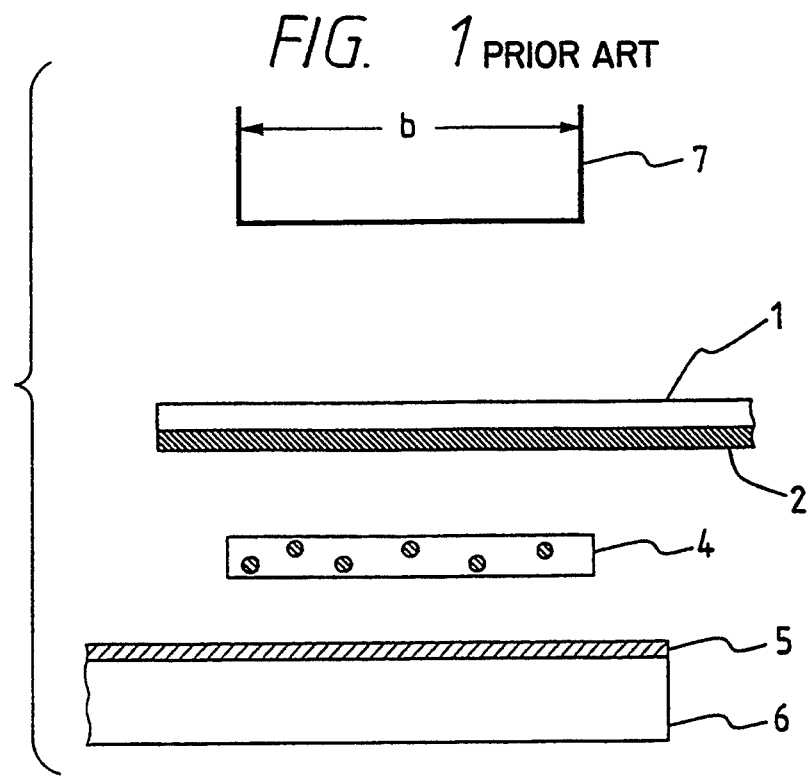
FIGS. 1 and 3 are schematic cross sectional views explaining examples of an electrically connecting method.
Figure 2:
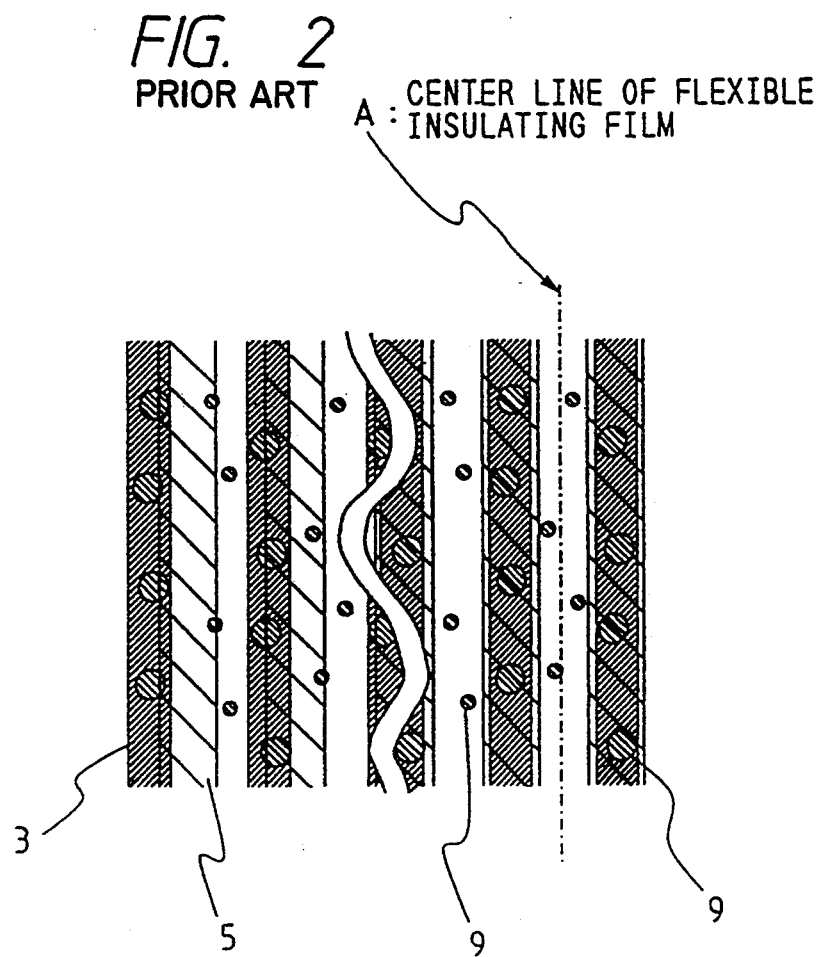
FIGS. 2 and 4 are schematic plan views explaining examples of an electrical connection structure with a pitch shift.
Figure 3:
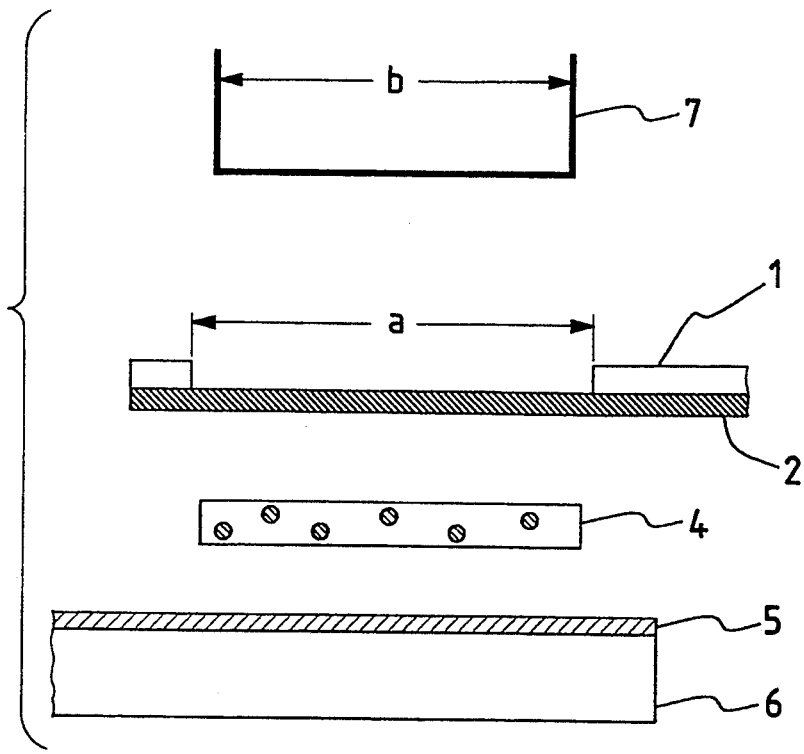
Figure 4:
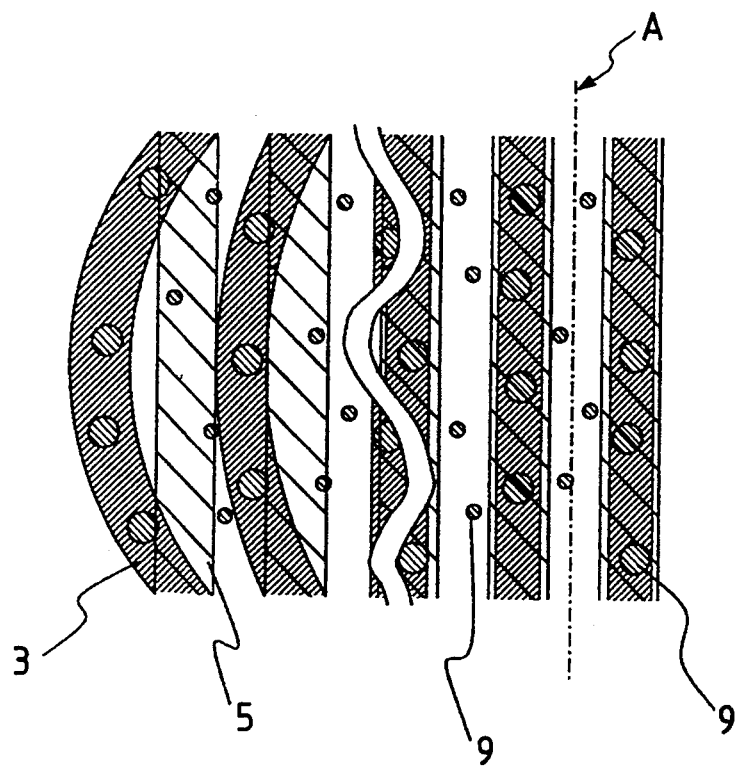
Figure 5:
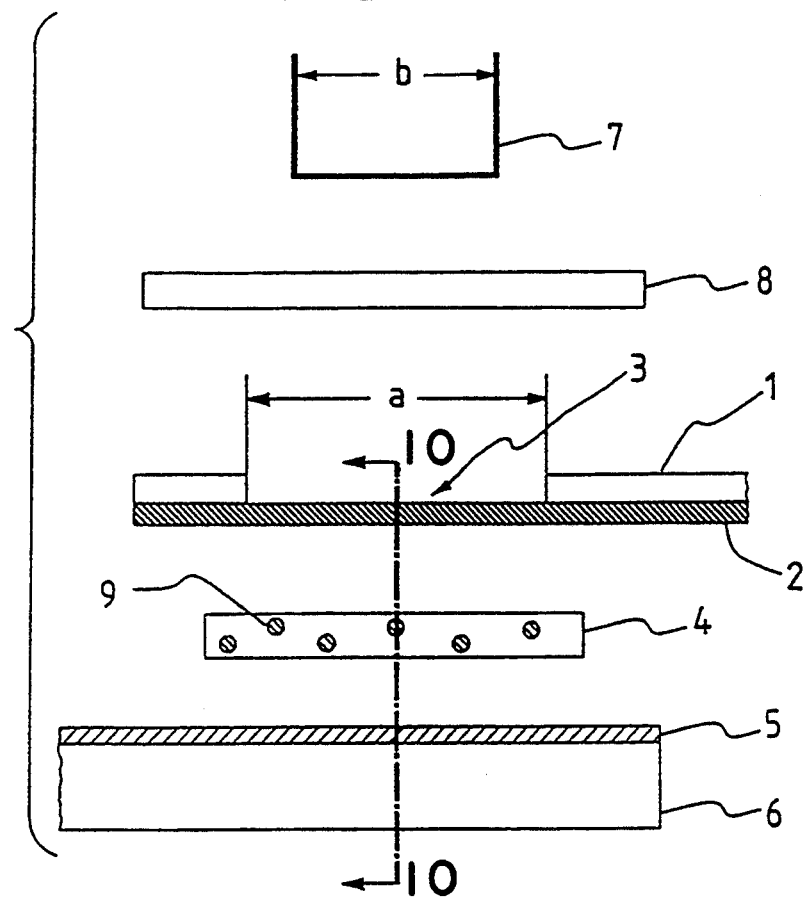
FIG. 5 is a schematic cross sectional view explaining an example of an electrically connecting method according to the present invention.
Figure 6:
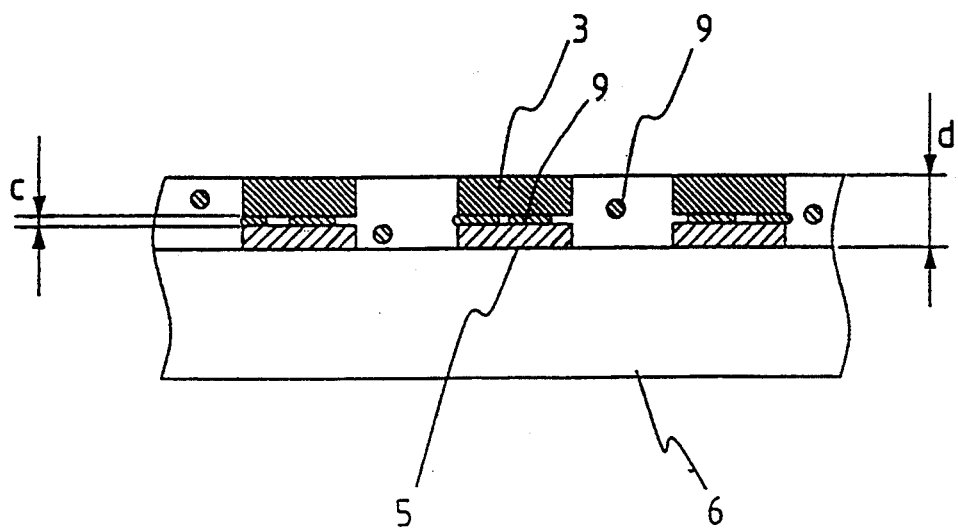
FIG. 6 is a schematic cross sectional view explaining an electrically connected area taken along line 10—10 of FIG. 5.

FIG. 5 is a schematic cross sectional view showing an example of a connection structure before electrical connection according to the present invention. FIG. 6 is a schematic cross sectional view of the connection structure after thermocompression bonding, taken along line 10—10 of FIG. 5.

In this embodiment, electrical connection between connection electrodes of a liquid crystal panel and wirings connected to a drive circuit will be described by way of example.

Figure 7:
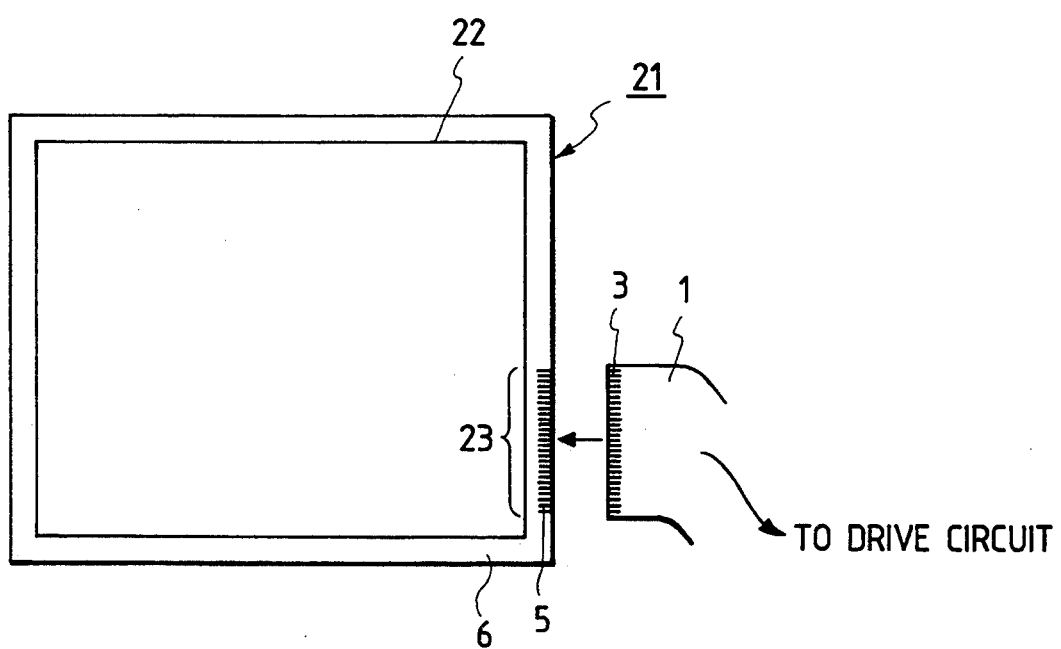
FIG. 7 is a schematic illustration explaining a liquid crystal panel to which the present invention was applied.

For example, as shown in FIG. 7, electrical connection between connection electrodes 5 and exposed electrodes 3 will be described. The electrodes 5 are formed on a cell glass 6 of a liquid crystal panel 21 having a liquid crystal display 22. The exposed electrodes 3 are formed on a flexible insulating film 1. Both the electrodes 5 and 3 are electrically connected by using an anisotropic conductive film (not shown).

The electrodes on a film carrier connected to a drive circuit (not shown in FIG. 7) have a so-called overhang structure that the copper foil 2 is exposed by removing the flexible film 1 as described previously. In order to prevent the exposed electrode 3 from being bent by a force caused by a flow of resin during the thermocompression bonding, it is preferable to set the copper foil thickness to a value from approximately 20 µm to 25 µm, and the exposed electrode length a to a value from approximately 1.5 mm to 2.5 mm. Soft etching of the adhesive surface in contact with the flexible film at the exposed electrode area is not performed generally, although it is necessary to consider the width and pitch of exposed electrodes.

It is desirable to set the width b of a thermocompression tool 7 in the longitudinal direction of the exposed electrode, to 80% or less of the length a of the exposed electrode, for example a value from approximately 1 mm to 2 mm. With such dimensions being set, it becomes possible to reduce the amount of resin between the liquid crystal panel electrode 5 and film carrier exposed electrode 3, by guiding resin of the anisotropic conductive layer 4 to the area not contributing to the electrical connection of the exposed electrode, i.e., by guiding the resin in the longitudinal direction of the electrode as viewed in FIG. 5. It becomes also possible to prevent the flow of resin from moving the exposed electrode laterally. It becomes also possible to shorten the gap c between electrodes to 2 µm or shorter.

The conductive particles such as solder particles 9 in the anisotropic conductive layer 4 can be deformed and the contact area of each conductive particle can be increased, thereby providing a more reliable electrical connection. With a proper setting of the exposed electrode length a and the thermocompression tool width b, it is possible to provide a highly reliable electrical connection if the length of an electrically connected electrode area is 1 mm or longer.

It is desirable to interpose a protective film 8 between the thermocompression tool 7 and the exposed electrodes 3. It is desirable to use as the material of the protective film 8, material having a compression strength from 7 Kgf/cm$^2$ to 170 Kgf/cm$^2$ more or less. By using the protective film having a thickness from approximately 25 µm to 50 µm, such as a 4-fluorinated ethylene film, the advantageous effect of pushing the exposed electrodes as well as good thermal conductivity can be obtained, thereby further preventing the exposed electrode 3 from being bent.

The protective film 8 also provides the advantageous effect of preventing unnecessary attachment of the material of the anisotropic conductive layer to the thermocompression tool 7. The 4-fluorinated ethylene film is preferable from this viewpoint.

It is conceivable that the strength P resistant to a force caused by a flow of resin of the anisotropic conductive film is related to the exposed electrode width b, electrode thickness h, electrode length l, and electrode physical property $\sigma$ (bending stress). Therefore, these parameters are preferably determined so as to satisfy $P \leq (4bh^2/l^2) * \sigma$ [kg/mm].

The electrode pitch is preferably more denser than a 125 μm pitch (8 electrodes/mm), and preferably more denser than a 100 μm pitch (10 electrodes/mm), so as to be more effective.

The optimum relationship between the electrode pitch and electrode width is determined depending upon an anisotropic conductive film to be used. Generally it is desirable to determine the relationship while considering the size and dispersion degree of conductive particles of an anisotropic conductive film. It is usual however to set the space between electrodes and the electrode width to 1:1.

It is desirable that the thickness of an anisotropic conductive film before the electrode connection is set to 10 to 30 μm. However, it is desirable to optionally determine the thickness from the size of conductive particles and the electrode thickness. For example, it is desirable to set the thickness of the anisotropic conductive film to about 15 μm for the electrode thickness of 18 μm. It is desirable that the thickness of the anisotropic film before the electrode connection is set to such a value so that the volume of the film can fill at least the gap between electrodes and/or between electrodes and its support.

If the anisotropic conductive film becomes too thick, in some cases the gap between electrodes cannot be shortened or the electrode may be bent because of an increased flow of resin, resulting in poor electrical connection. It is therefore desirable to pay attention to such an excessively thick film.

As shown in FIG. 6, the anisotropic conductive film containing low melting metal particles such as solder is used, and so the particles at the thermocompressed are deformed and become bigger than initial particles (e.g., a particle of 10 μm diameter is deformed to a particle of 50 μm diameter). The deformation of conductive particles is not significant for the present invention. For example, some conductive particles of metal plated resin balls are hardly deformed depending upon the material of the resin balls. Obviously, use of such particles falls within the scope of the present invention.

(1ST EMBODIMENT)

The liquid panel and external drive circuit shown in FIG. 5 were electrically connected under the following conditions:
Length a of exposed electrode: 2.5 mm
Copper foil thickness at exposed electrode area: 20 μm
Electrode pitch: 100 μm
Width b of thermocompression tool in longitudinal direction of exposed electrode: 1.5 mm
Compression strength of protective film: 120 Kgf/cm²
Protective film thickness: 50 μm The connection area after the thermocompression bonding was observed using a metal microscope (×50). Neither position shift nor bending of exposed electrodes were found. The completed liquid crystal apparatus was driven, and an image of excellent quality was displayed over the whole area of the display screen.

(Comparison 1)

For the sake of comparison, a liquid crystal panel and external drive circuit were electrically connected without removing the flexible film under the following conditions:
Length a of exposed electrode: none (with flexible film attached)
Copper foil thickness at electrode area: 20 μm
Electrode pitch: 100 μm
Width b of thermocompression tool in longitudinal direction of electrode: 3 mm
Compression strength of protective film: 120 Kgf/cm²
Protective film thickness: 50 μm The connection area after the thermocompression bonding was observed using the metal microscope (×50). It was found that the outermost electrode has a position shift of 20 μm because of the thermal expansion of the flexible film. The completed liquid crystal apparatus was driven, and it was found that some of the display was turbulent.

(Comparison 2)

A liquid crystal panel and external drive circuit were electrically connected by using longer exposed electrodes and a thinner copper foil than those of the present invention under the following conditions:
Length a of exposed electrode: 4 mm
Copper foil thickness at exposed electrode area: 15 or 20 μm
Electrode pitch: 100 μm
Width b of thermocompression tool in longitudinal direction of exposed electrode: 3 mm
Compression strength of protective film: 120 Kgf/cm²
Protective film thickness: 50 μm The connection area after the thermocompression bonding was observed using the metal microscope (×50). It was found that the outermost electrode has a position shift of 100 μm (for the electrode thickness 15 μm) or 50 μm (for the electrode thickness 20 μm) because of the bending of the copper foil. The completed liquid crystal apparatus was driven, and it was found that some of the display was turbulent.

As described so far, the film carrier connection electrodes of an overhang structure are used, the copper foil thickness of exposed electrodes is set to a value from approximately 20 μm to 25 μm, the exposed electrode length is set to a value from approximately 1.5 mm to 2.5 mm, and the thermocompression tool width is set to a value from approximately 1 mm to 2 mm. With these settings, device electrodes and film electrodes denser than 100 μm pitch (more than 10 electrodes/mm) can be electrically connected reliably and without an electrode position shift.

Conventionally, it is necessary to set the exposed electrode length to at least 3 mm or longer in the case of exposed electrodes of an overhang structure using an anisotropic film. In contrast with this, according to the present invention, it is possible to use an exposed electrode having a length of 2.5 mm or shorter, with a high rigidity of the exposed electrode area and an improved manufacturing yield of a film carrier.

It is obvious that the present invention is not limited necessarily to the above description and embodiments, but various modifications within the scope of the present invention are possible.

It is not necessary to use the same electrode pitch over the whole connection area. The present invention is applicable to electrodes some of which are formed at a high integration degree.

What is claimed is:

1. An electrical connection structure comprising:
   a first set of electrodes formed on a device side;
   a second set of electrodes formed on a flexible film carrier having an electrode pattern and connected to a drive circuit; and
   an anisotropic conductive film having metal particles or metal plated particles dispersed therein, interposed between said first set of electrodes and said second set of electrodes, for electrically connecting said electrodes facing each other through thermocompression bonding,
   wherein said second set of electrodes is exposed at an electrical connection area where the flexible film is removed,
   with said electrodes at said exposed area having a width b, a thickness h, a length l, and an electrode bending stress $\sigma$ having values such that the following equation is satisfied:
   $P \leq (4bh^2/l^2) \cdot \sigma$, and $1.5 \text{ mm} \leq l \leq 2.5 \text{ mm}$,
   wherein P is the force caused by a flow of resin of said anisotropic conductive film,
   and the thickness of said anisotropic film before the electrode connection is set to such a value that the volume of said anisotropic film can fill at least a gap between said first and second sets of electrodes and/or between said first and second sets of electrodes and their respective support.

2. An electrical connection structure according to claim 1, wherein the thickness of each said exposed electrode is set to a value in the range of 20 $\mu$m to 25 $\mu$m.

3. An electrical connection structure according to claim 1, wherein the gap between said first set of electrodes and said second set of electrodes is 2 $\mu$m to 10 $\mu$m after electrical connection using said anisotropic conductive film.

4. An electrical connection structure according to claim 1, wherein said anisotropic conductive film contains conductive particles capable of being deformed by a compression force.

5. An electrical connection structure according to claim 1, wherein said first set of electrodes and said second set of electrodes are partially formed at a pitch no greater than 125 $\mu$m.

* * * * *

UNITED STATES PATENT AND TRADEMARK OFFICE
CERTIFICATE OF CORRECTION

PATENT NO. : 5,360,943
DATED : November 1, 1994
INVENTOR(S) : Mori et al.

It is certified that error appears in the above-indentified patent and that said Letters Patent is hereby corrected as shown below:

COLUMN 1:

Line 8, "derive" should read --drive--.

COLUMN 3:

Line 42, "or longer" should be deleted.

Signed and Sealed this

Eleventh Day of July, 1995

Attest:

BRUCE LEHMAN

Attesting Officer          Commissioner of Patents and Trademarks